(12) United States Patent
Takahashi et al.

(10) Patent No.: US 11,043,794 B2
(45) Date of Patent: Jun. 22, 2021

(54) HOUSING AND WIRE HARNESS

(71) Applicants: Yazaki Corporation, Tokyo (JP); TOYOTA JIDOSHA KABUSHIKI KAISHA, Toyota (JP)

(72) Inventors: Kazuya Takahashi, Aichi (JP); Yoshimichi Yamao, Aichi (JP); Masanobu Suzuki, Okazaki (JP); Hiroyuki Ohno, Takahama (JP)

(73) Assignees: YAZAKI CORPORATION, Tokyo (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/693,699

(22) Filed: Nov. 25, 2019

(65) Prior Publication Data

US 2020/0169067 A1 May 28, 2020

(30) Foreign Application Priority Data

Nov. 28, 2018 (JP) .............................. JP2018-221858

(51) Int. Cl.
*H01B 7/00* (2006.01)
*H02G 3/08* (2006.01)
(Continued)

(52) U.S. Cl.
CPC ........... *H02G 3/081* (2013.01); *H01B 7/0045* (2013.01); *H02G 3/14* (2013.01); *H05K 5/0004* (2013.01);
(Continued)

(58) Field of Classification Search
CPC ............ B60R 13/0884; B60R 16/0215; B60R 16/0239; H01B 7/0045; H01B 7/00;
(Continued)

(56) References Cited

U.S. PATENT DOCUMENTS 5,174,786 A * 12/1992 Kato .................... H01R 13/641
439/352
5,813,793 A * 9/1998 Baucom ............... H05K 5/0021
292/127
(Continued)

FOREIGN PATENT DOCUMENTS

CN 106711885 A * 5/2017 ......... B60R 16/0215
JP 3-83415 U 8/1991
(Continued)

*Primary Examiner* — Timothy J Thompson
*Assistant Examiner* — Guillermo J Egoavil
(74) *Attorney, Agent, or Firm* — Sughrue Mion, PLLC

(57) ABSTRACT

A housing of a wire harness includes a first member and a second member that store therein an object to be stored; a locking mechanism that locks the first member and the second member, when a first locking surface and a second locking surface are locked to each other in a first direction; and a stabilizer mechanism that includes a fitting surface projecting from the first member to outside, and a biasing part that projects from the second member to the outside, that is elastically and deformably provided along the first direction, that is elastically deformed by coming into contact with the fitting surface while the first member and the second member are locked by the locking mechanism, and that generates biasing force for pressing the second locking surface toward the first locking surface side along the first direction.

20 Claims, 7 Drawing Sheets

(51) Int. Cl.
  *H02G 3/14* (2006.01)
  *H05K 5/00* (2006.01)
  *H05K 5/02* (2006.01)
  *B60R 13/08* (2006.01)
  *B60R 16/02* (2006.01)
  *B60R 16/023* (2006.01)

(52) U.S. Cl.
  CPC ......... *H05K 5/0221* (2013.01); *H05K 5/0226* (2013.01); *H05K 5/0247* (2013.01); *B60R 13/0884* (2013.01); *B60R 16/0215* (2013.01); *B60R 16/0239* (2013.01)

(58) Field of Classification Search
  CPC ............ H02G 3/081; H02G 3/14; H02G 3/08; H05K 5/0004; H05K 5/0052; H05K 5/0221; H05K 5/0226; H05K 5/0247; H05K 5/00; H05K 5/02
  USPC .......................................................... 174/561
  See application file for complete search history.

(56) References Cited

U.S. PATENT DOCUMENTS

| | | | | |
|---|---|---|---|---|
| 8,413,833 | B1 * | 4/2013 | Taylor | H05K 5/0221 |
| | | | | 220/315 |
| 8,783,500 | B1 * | 7/2014 | McPeek | A45C 11/00 |
| | | | | 220/545 |
| 2008/0083547 | A1 * | 4/2008 | Pinol Pedret | H05K 7/026 |
| | | | | 174/50 |
| 2010/0181091 | A1 * | 7/2010 | Drane | H02G 3/088 |
| | | | | 174/66 |
| 2016/0315459 | A1 * | 10/2016 | Nakashima | H05K 5/0247 |
| 2016/0361539 | A1 * | 12/2016 | Nathanson | A61N 1/0452 |
| 2017/0338635 | A1 * | 11/2017 | Stahl, II | H05K 3/38 |

FOREIGN PATENT DOCUMENTS

| | | | | |
|---|---|---|---|---|
| JP | 2000316746 A | * | 11/2000 | |
| JP | 2008-172893 A | | 7/2008 | |
| JP | 2008172893 A | * | 7/2008 | ............ H02G 3/16 |
| JP | 2014-187826 A | | 10/2014 | |

* cited by examiner

HOUSING AND WIRE HARNESS

CROSS-REFERENCE TO RELATED APPLICATION(S)

The present application claims priority to and incorporates by reference the entire contents of Japanese Patent Application No. 2018-221858 filed in Japan on Nov. 28, 2018.

BACKGROUND OF THE INVENTION

1. Field of the Invention

The present invention relates to a housing and a wire harness.

2. Description of the Related Art

As a conventional housing applied to a wire harness of a vehicle and the like, for example, Japanese Patent Application Laid-open No. 2014-187826 discloses a wire harness protector including a wire harness storage, a lid, a female lock, a male lock, and a pressing mechanism. The female lock is provided on a first side wall of the wire harness storage. The male lock is provided on a first side part of the lid. The pressing mechanism is provided on the lid, and while the lid is sealing the opening of the wire harness storage, the pressing mechanism presses the first side wall from the opening of the wire harness storage toward a direction of the bottom wall of the wire harness storage.

In the wire harness protector disclosed in Japanese Patent Application Laid-open No. 2014-187826 described above, for example, there is still room for further improvement in preventing abnormal noise from occurring due to looseness.

SUMMARY OF THE INVENTION

The present invention has been made in view of the above circumstances, and an object of the present invention is to provide a housing and a wire harness that can suitably prevent abnormal noise from occurring.

In order to achieve the above mentioned object, a housing according to one aspect of the present invention includes a first member and a second member that face opposite to each other along a first direction, that are assembled to each other, and that store therein an object to be stored; a locking mechanism that includes a first locking surface provided on the first member and a second locking surface provided on the second member, and that locks the first member and the second member when the first locking surface and the second locking surface are locked to each other in the first direction; and a stabilizer mechanism that includes a fitting surface projecting from the first member to outside, and a biasing part that projects from the second member to the outside, that is elastically and deformably provided along the first direction, that is elastically deformed by coming into contact with the fitting surface while the first member and the second member are locked by the locking mechanism, and that generates biasing force for pressing the second locking surface toward the first locking surface side along the first direction.

According to another aspect of the present invention, in the housing, it is possible to configure that the stabilizer mechanism includes a pair of protection projecting parts that project from the second member to the outside, and that are disposed with the biasing part interposed therebetween.

According to still another aspect of the present invention, in the housing, it is possible to configure that the biasing part includes an extended part that extends from the second member along a direction intersecting with the first direction, and a bent end part that is placed at a tip end side of the extended part and that is bent from the extended part toward the fitting surface.

According to still another aspect of the present invention, in the housing, it is possible to further include that a hinge part that rotatably supports the second member with respect to the first member, wherein the stabilizer mechanism is provided on a surface that faces a surface on which the hinge part is placed, in the first member and the second member.

According to still another aspect of the present invention, in the housing, it is possible to configure that the stabilizer mechanism is placed away from the hinge part than the locking mechanism, when viewed from a rotation axis direction that is when viewed along a rotation axis serving as a rotation center of the first member and the second member, while the first member and the second member are locked by the locking mechanism.

According to still another aspect of the present invention, in the housing, it is possible to configure that the locking mechanisms includes a plurality of locking mechanisms, and number of the stabilizer mechanism is smaller than that of the locking mechanisms.

In order to achieve the above mentioned object, a wire harness according to still another aspect of the present invention includes a wire material with conductivity; and a housing assembled to the wire material, wherein the housing includes a first member and a second member that face opposite to each other along a first direction, that are assembled to each other, and that store therein an object to be stored, a locking mechanism that includes a first locking surface provided on the first member and a second locking surface provided on the second member, and that locks the first member and the second member when the first locking surface and the second locking surface are locked to each other in the first direction, and a stabilizer mechanism that includes a fitting surface projecting from the first member to outside, and a biasing part that projects from the second member to the outside, that is elastically and deformably provided along the first direction, that is elastically deformed by coming into contact with the fitting surface while the first member and the second member are locked by the locking mechanism, and that generates biasing force for pressing the second locking surface toward the first locking surface side along the first direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
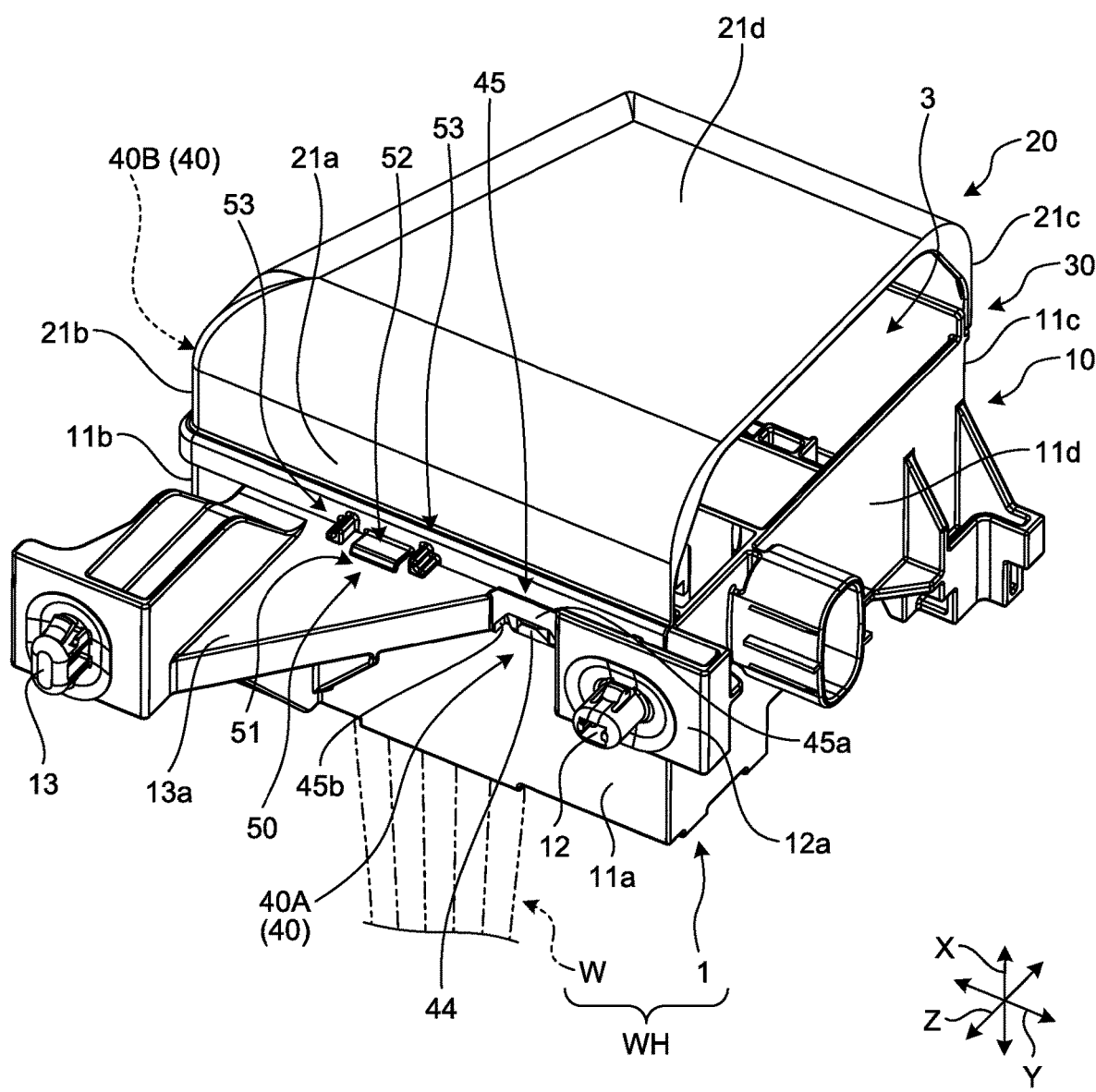
FIG. 1 is a perspective view illustrating a schematic configuration of a housing according to an embodiment.
Figure 2:
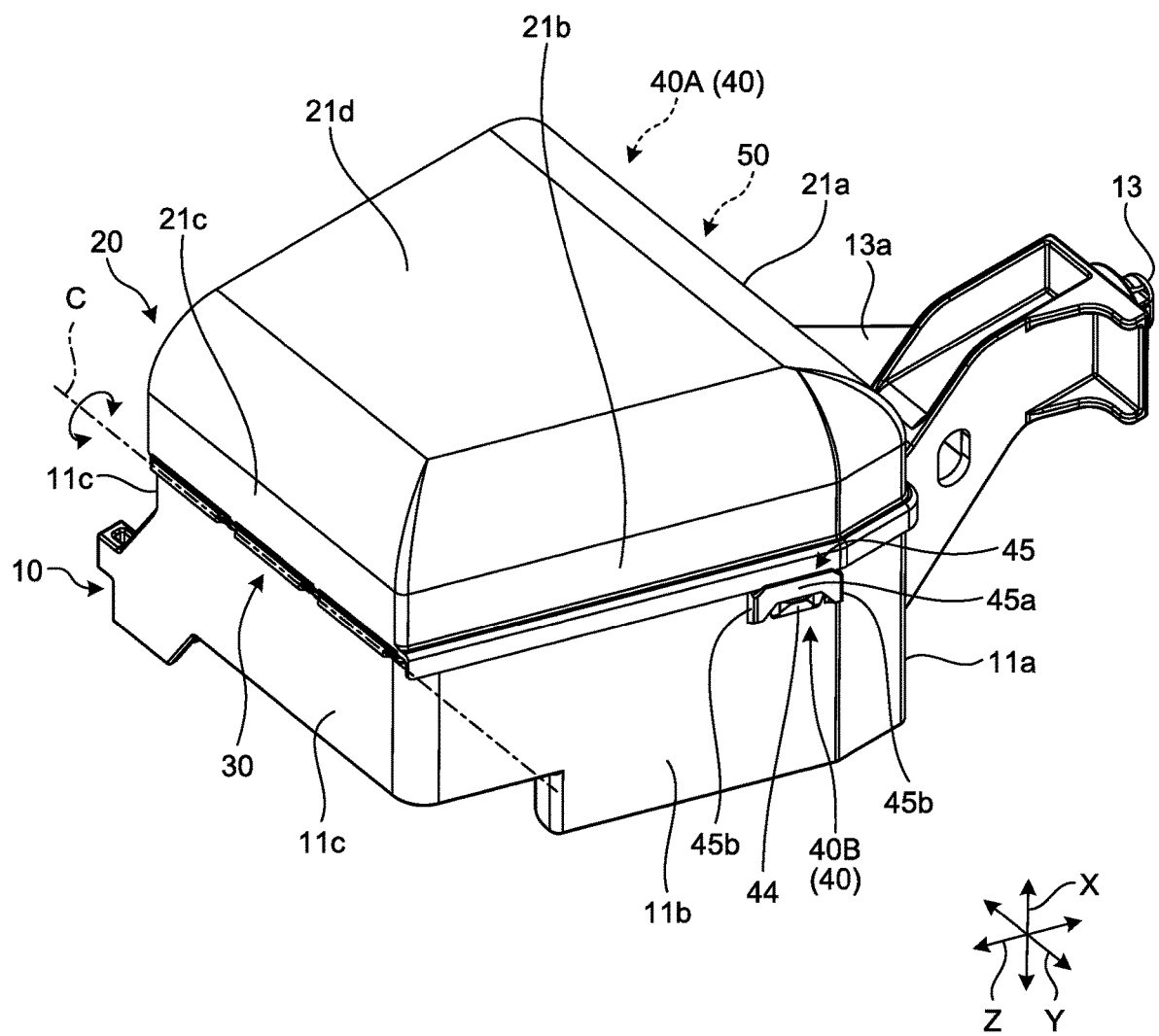
FIG. 2 is a perspective view illustrating a schematic configuration of the housing according to the embodiment.

Hereinafter, an embodiment according to the present invention will be described in detail with reference to the accompanying drawings. It is to be noted that the present invention is not limited to the embodiment. Moreover, components in the following embodiment include components that can be easily replaced by those skilled in the art, or components substantially the same as those components.

In the following FIG. 1, a part of wire materials is omitted and illustrated by two-dot chain lines, and in other drawings, the illustration of the wire materials is omitted. Similarly, in FIG. 3, a part of an object to be stored is omitted and illustrated by a two-dot chain line, and in other drawings, the illustration of the object to be stored is omitted. Moreover, in the following explanation, three directions intersecting with each other are each referred to a "first direction X", a "second direction Y", and a "third direction Z" for the sake of convenience. In this example, the first direction X, the second direction Y, and the third direction Z are orthogonal to each other. Typically, the first direction X corresponds to a laminating direction of a base member and a cover member, and corresponds to a facing direction of the base member and the cover member. Typically, the second direction Y corresponds to an axial direction along the rotation axis that is to be the rotation center of the cover member with respect to the base member. Typically, the third direction Z corresponds to a projection direction of a fitting surface, a biasing part, and a protection projecting part from the base material and the cover material. Unless otherwise specified, the directions used in the following description indicate directions in the state in which the units are assembled with one another.

Embodiment

A housing 1 according to the present embodiment illustrated in FIG. 1, FIG. 2, FIG. 3, and FIG. 4 is incorporated into a wire harness WH mounted on a vehicle such as an automobile. For example, the wire harness WH is a collective component that is obtained by bundling a plurality of wire materials W (see FIG. 1) used for supplying power or signal communication, for connecting devices mounted on a vehicle. The wire harness WH allows the wire materials W to be connected to the devices by a connector and the like. The wire harness WH includes the wire materials W with conductivity and the housing 1 assembled to the wire materials W. For example, each of the wire materials W includes a metal rod, an electric wire, an electric wire bundle, and the like. The metal rod is obtained by covering the outside of a rod-like member with conductivity, by a covering part with insulating properties. The electric wire is obtained by covering the outside of a conductor part (core line) formed of a plurality of metal strands with conductivity, by a covering part with insulating properties. The electric wire bundle is obtained by bundling a plurality of the electric wires. In the wire harness WH, the wire materials W are bundled and integrated, and the housing 1 is assembled to the wire materials W. The wire harness WH may also include a grommet, a protector, an exterior material, a fixture, and the like in addition to the above.

The housing 1 stores and protects an object to be stored 2 (see FIG. 3) in a housing space part 3 provided in the interior. The housing 1 in the present embodiment configures a part of a connector cover incorporated into the wire harness WH. The wire materials W are inserted into the connector cover, and the connector cover stores and protects a plurality of connectors and the like provided on the end parts of the wire materials W in the housing 1 as the object to be stored 2. For example, the housing 1 may also configure a part of a protector, an electrical connection box, and the like incorporated into the wire harness WH, instead of the connector cover. The wire materials W are inserted into the protector, and the protector stores and protects a part of the wire materials W in the housing 1 as the object to be stored. In other words, the protector is externally mounted on the wire materials W, and protects the wire materials W. The wire materials W are inserted into the electrical connection box, and the electrical connection box stores and protects an electronic component and the like electrically connected to the wire materials W in the housing 1 as the object to be stored. For example, the electrical connection box stores therein an electronic component such as a capacitor, a relay, a resistance, a transistor, a fuse, a connector, a junction, an intelligent power switch (IPS), an electronic control unit such as a microcomputer, and the like as the object to be stored in an integral manner. The electrical connection box also distributes electric power supplied from the power source to various electronic devices in the vehicle, via the wire materials W. The electrical connection box may also be referred to as a junction box, a fuse box, a relay box, and the like. Hereinafter, a configuration of the housing 1 will be described in detail with reference to the accompanying drawings.

More specifically, the housing 1 includes a base member 10 serving as a first member, a cover member 20 serving as a second member, a hinge part 30, and a locking mechanism 40. With this configuration, the housing 1 stores therein and protects the object to be stored 2 by the base member 10 and the cover member 20 that are laminated along the first direction X and that are assembled to each other. By further including a stabilizer mechanism 50, the housing 1 of the present embodiment has implemented a configuration that can prevent looseness and that can suitably prevent abnormal noise from occurring. The whole housing 1 including the base member 10, the cover member 20, the hinge part 30, the locking mechanism 40, and the stabilizer mechanism 50 is integrally formed of a resin material with insulating properties.

The base member 10 and the cover member 20 face opposite to each other along the first direction X, are assembled to each other, and store therein the object to be stored 2. While being assembled to each other, the base member 10 and the cover member 20 are formed in a hollow box shape as a whole, and form the storage space part 3 in the hollow interior. The storage space part 3 is a space part for storing the object to be stored 2, and is partitioned off by the base member 10 and the cover member 20.

The base member 10 is a main member for forming the storage space part 3. The base member 10 is formed in a hollow shape by wall parts 11a, 11b, 11c, and 11d. The wall parts 11a, 11b, 11c, and 11d are wall bodies for forming the storage space part 3. The wall part 11a configures a wall body of one side in the third direction Z among the wall bodies that form the storage space part 3. The wall part 11c configures a wall body of the other side in the third direction Z among the wall bodies that form the storage space part 3. The wall part 11a and the wall part 11c face opposite to each other in the third direction Z. The wall part 11a and the wall part 11c both extend along the second direction Y. In this example, the length of the wall part 11a along the second direction Y is longer than that of the wall part 11c. The wall part 11b configures a wall body of one side in the second direction Y among the wall bodies that form the storage space part 3. The wall part 11d configures a wall body of the other side in the second direction Y among the wall bodies that form the storage space part 3. The wall part 11b and the wall part 11d face opposite to each other in the second direction Y. A part of the wall part 11b extends along the third direction Z, and the other part of the wall part 11b is inclined with respect to the third direction Z. The wall part 11d extends along the third direction Z.

By integrally forming the wall parts 11a, 11b, 11c, and 11d, the base member 10 is formed in a substantially polygonal cylinder shape (substantially trapezoidal cylinder shape) opened to both sides in the first direction X as a whole. The base member 10 is provided with partition walls, locking parts, and the like used for assembling the object to be stored 2 into the housing space part 3 that is formed by the wall parts 11a, 11b, 11c, and 11d. In the base member 10, the cover member 20 is assembled to one opening side in the first direction X, and the wire materials W are inserted into the other opening side in the first direction X.

Moreover, in the base member 10, clamps 12 and 13 are provided on the outer surface of the wall part 11a. The clamps 12 and 13 are fixtures for fixing the housing 1 to a body and the like of a vehicle. In the wall part 11a, the clamp 12 is provided on the end part at the wall part 11d side in the second direction Y via a bracket part 12a. The bracket part 12a is formed in a substantially rectangular plate shape the plate-thickness direction of which extends along the third direction Z. The bracket part 12a supports the clamp 12 on the wall part 11a. In the wall part 11a, the clamp 13 is provided on the end part at the wall part 11b side in the second direction Y, via the bracket part 13a. The bracket part 13a is formed in a substantially triangle plate shape the plate thickness direction of which extends along the first direction X. The bracket part 13a supports the clamp 13 on the wall part 11a.

The cover member 20 is a lid-shaped (cover-shaped) member that seals the opening of the base member 10 at one side in the first direction X. The cover member 20 is formed in a hollow shape by wall parts 21a, 21b, and 21c, and a plate part 21d. The wall parts 21a, 21b, and 21c are wall bodies that form the storage space part 3. The wall part 21a configures a wall body at one side (wall part 11a side) in the third direction Z among the wall bodies that form the storage space part 3. The wall part 21c configures a wall body at the other side (wall part 11c side) in the third direction Z among the wall bodies that form the storage space part 3. The wall part 21a and the wall part 21c face opposite to each other in the third direction Z. The wall parts 21a and 21c both extend along the second direction Y. In this example, the length of the wall part 21a along the second direction Y is longer than that of the wall part 21c. The wall part 21b configures a wall body at one side (wall part 11b side) in the second direction Y among the wall bodies that form the storage space part 3. A part of the wall part 21b extends along the third direction Z, and the other part is inclined with respect to the third direction Z. The plate part 21d is a sealing body that seals one side (side opposite to the side that faces the base member 10) of the wall parts 21a, 21b, and 21c in the first direction X. By integrally forming the wall parts 21a, 21b, and 21c, and the plate part 21d, the cover member 20 is formed in a substantially polygonal lid shape (substantially trapezoidal lid shape) opened to the other side (side that faces the base member 10) in the first direction X as a whole.

The hinge part 30 is interposed between the base member 10 and the cover member 20, and rotatably supports the cover member 20 with respect to the base member 10. In other words, the base member 10 and the cover member 20 are integrally formed by being coupled so as to be able to rotate relative to each other via the hinge part 30. The hinge part 30 rotatably supports the wall part 21c of the cover member 20 with respect to the wall part 11c of the base member 10. For example, the hinge part 30 is interposed between the wall part 11c and the wall part 21c, and is formed as a thin section (section thinner than the plate thickness of the wall parts 11a, 11b, 11c, 11d, 21a, 21b, and 21c, and the like) that extends along the second direction Y. With this configuration, the hinge part 30 configures a rotating shaft extending along the second direction Y, and a rotation axis C is set along the second direction Y. The rotation axis C is an axis that is to be the rotation center of the cover member 20 with respect to the base member 10.

As described above, the cover member 20 can be rotated to the close position and the open position (see FIG. 3 and FIG. 4) by rotating around the rotation axis C via the hinge part 30. The close position of the cover member 20 is the position where the opening of the base member 10 at one side in the first direction X is closed by the cover member 20 (see FIG. 1 and FIG. 2). In the cover member 20, at the close position, the tip end part of the wall part 21a in the first direction X is placed adjacent to the outside of the wall part 11a, and the tip end part of the wall part 21b in the first direction X is placed adjacent to the outside of the wall part 11b. Moreover, the tip end part of the wall part 21c in the first direction X is placed adjacent to the outside of the wall part 11c, and the plate part 21d is placed so as to face the opening of the base member 10 along the first direction X. On the other hand, the open position of the cover member 20 is the position where the opening is opened by the cover member 20 (see FIG. 3 and FIG. 4).

Figure 5:
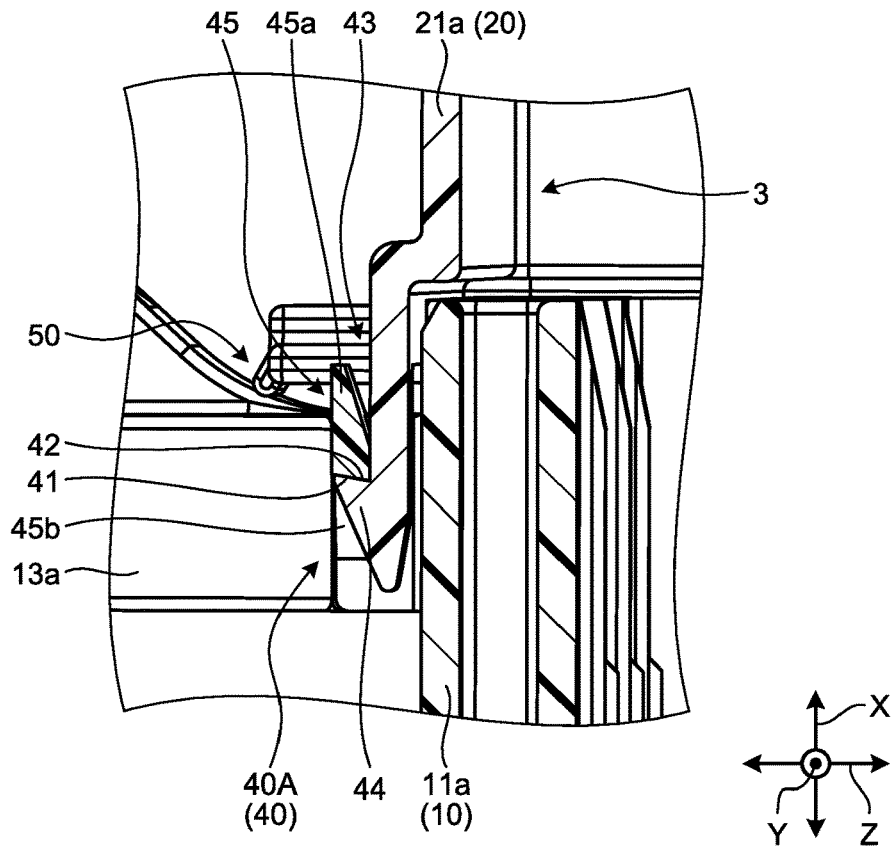
FIG. 5 is a fragmentary sectional view of the housing according to the embodiment including a locking mechanism.

The locking mechanism 40 is a mechanism that locks the base member 10 and the cover member 20 to each other at the close position. As illustrated in FIG. 5, the locking mechanism 40 includes a first locking surface 41 provided on the base member 10 and a second locking surface 42 provided on the cover member 20. The locking mechanism 40 locks the base member 10 and the cover member 20, when the first locking surface 41 and the second locking surface 42 are locked to each other in the first direction X. In this example, a total of two locking mechanisms 40 are provided, one at a position where the wall part 11a is locked with the wall part 21a, and the other at a position where the wall part 11b is locked with the wall part 21b.

In the following explanation, when the two locking mechanisms 40 are to be differentiated, the locking mechanism 40 at the wall parts 11a and 21a side may be referred to as a "locking mechanism 40A", and the locking mechanism 40 at the wall parts 11b and 21b side may be referred to as a "locking mechanism 40B". When the two locking mechanisms 40 need not be particularly differentiated, the locking mechanisms 40 may be simply referred to as the "locking mechanism 40".

More specifically, as illustrated in FIG. 1, FIG. 2, FIG. 3, FIG. 4, and FIG. 5, each of the locking mechanisms 40 includes a locking piece 43, a locking claw part 44, and a part to be locked 45.

The locking piece 43 is provided on one of the base member 10 and the cover member 20, in this example, on the cover member 20. While the cover member 20 is at the close position, the locking piece 43 projects from the wall parts 21a and 21b toward the base member 10 side along the first direction X, in a substantially rectangular plate shape (see also FIG. 6 and the like). In the wall part 21a, the locking piece 43 of the locking mechanism 40A is provided at a position closer to the side opposite to the wall part 21b side, than the center position in the second direction Y. In this example, while the cover member 20 is at the close position, the locking piece 43 of the locking mechanism 40A is placed between the bracket part 12a and the bracket part 13a. In the wall part 21b, the locking piece 43 of the locking mechanism 40B is provided at a position (vicinity of bent part) closer to the wall part 21a side than the center position in the third direction Z.

The locking claw part 44 is formed on the locking piece 43 in a claw shape. The locking claw part 44 is locked to the part to be locked 45. The locking claw part 44 projects from the outer surface side (side opposite to the housing space part 3 side) of the locking piece 43 to the outside. While the cover member 20 is at the close position, the surface at one side in the first direction X (surface that faces the side opposite to the base member 10 side) of the locking claw part 44 configures the second locking surface 42 described above.

The part to be locked 45 is provided on the other of the base member 10 and the cover member 20, in this example, on the base member 10. The part to be locked 45 is a portion to which the locking claw part 44 is locked. While the cover member 20 is at the close position, in the wall parts 11a and 11b, the part to be locked 45 is formed at a position that faces the locking piece 43 along the first direction X. In the wall part 11a, the part to be locked 45 of the locking mechanism 40A is provided at a position closer to the side opposite to the wall part 11b side than the center position in the second direction Y, which is a position that faces the locking piece 43 of the locking mechanism 40A along the first direction X. In this example, the part to be locked 45 of the locking mechanism 40A is placed between the bracket part 12a and the bracket part 13a. In the wall part 11b, the part to be locked 45 of the locking mechanism 40B is provided at a position (vicinity of bent part) closer to the wall part 21a side than the center position in the third direction Z, which is a position that faces the locking piece 43 of the locking mechanism 40B along the first direction X. Consequently, while the base member 10 and the cover member 20 are at the close position, each of the parts to be locked 45 is formed at a position that can be locked with the locking claw part 44. In this example, the part to be locked 45 includes a plate-shaped part 45a that extends along the second direction Y or the third direction Z, and a pair of support parts 45b that support both end parts of the plate-shaped part 45a (see also FIG. 8). While the cover member 20 is at the close position, in the part to be locked 45, a surface at one side of the plate-shaped part 45a in the first direction X (surface that faces the side opposite to the cover member 20 side) configures the first locking surface 41 described above.

In the locking mechanism 40 configured as described above, while the base member 10 and the cover member 20 are at the close position, the locking piece 43 is inserted between the pair of support parts 45b of the part to be locked 45 along the first direction X. Then, when the second locking surface 42 of the locking claw part 44 is locked to the first locking surface 41 of the part to be locked 45 in the first direction X, the locking mechanism 40 can lock the base member 10 and the cover member 20 at the close position.

Figure 3:
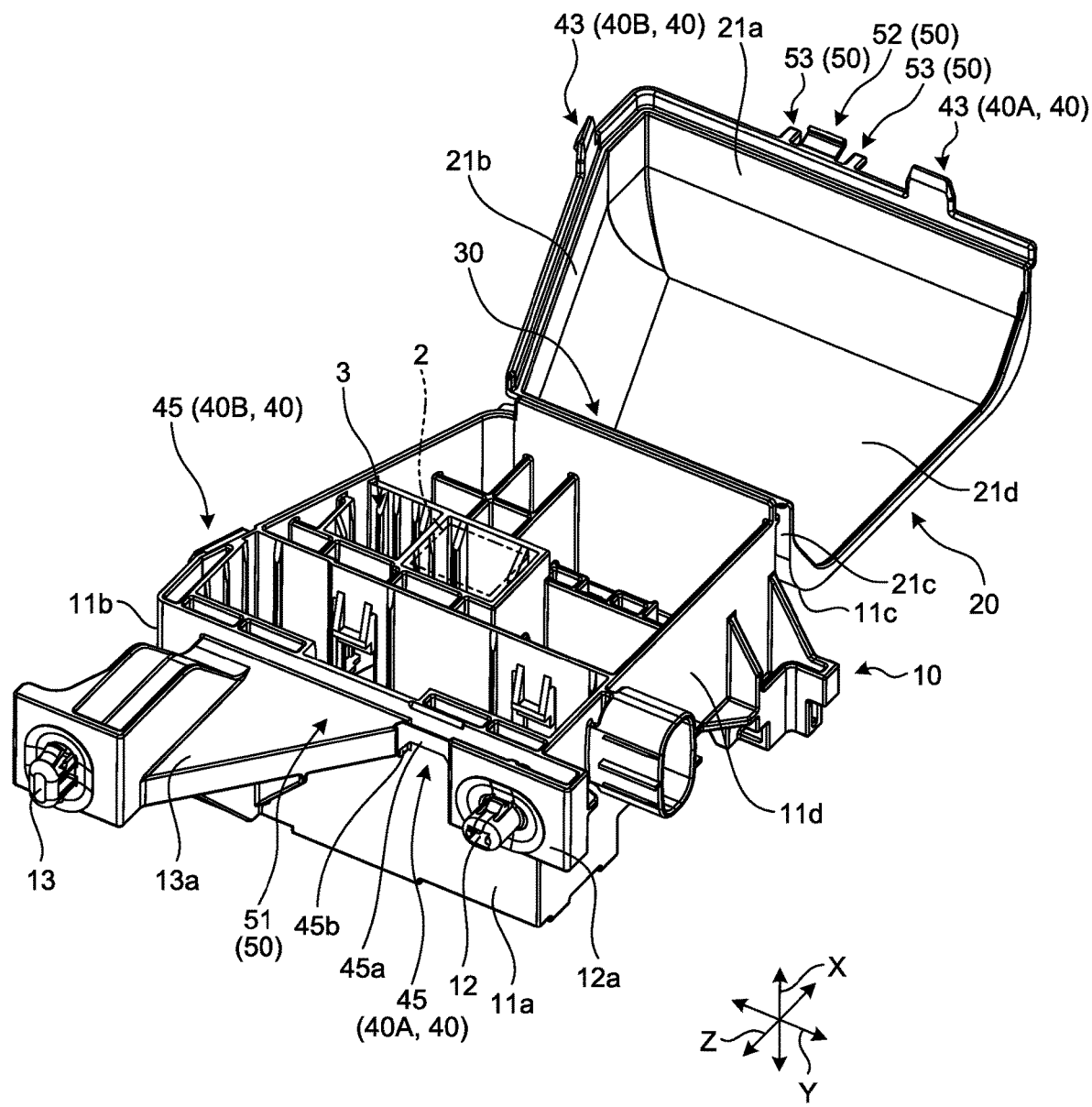
FIG. 3 is a perspective view illustrating a schematic configuration of the housing according to the embodiment.
Figure 4:
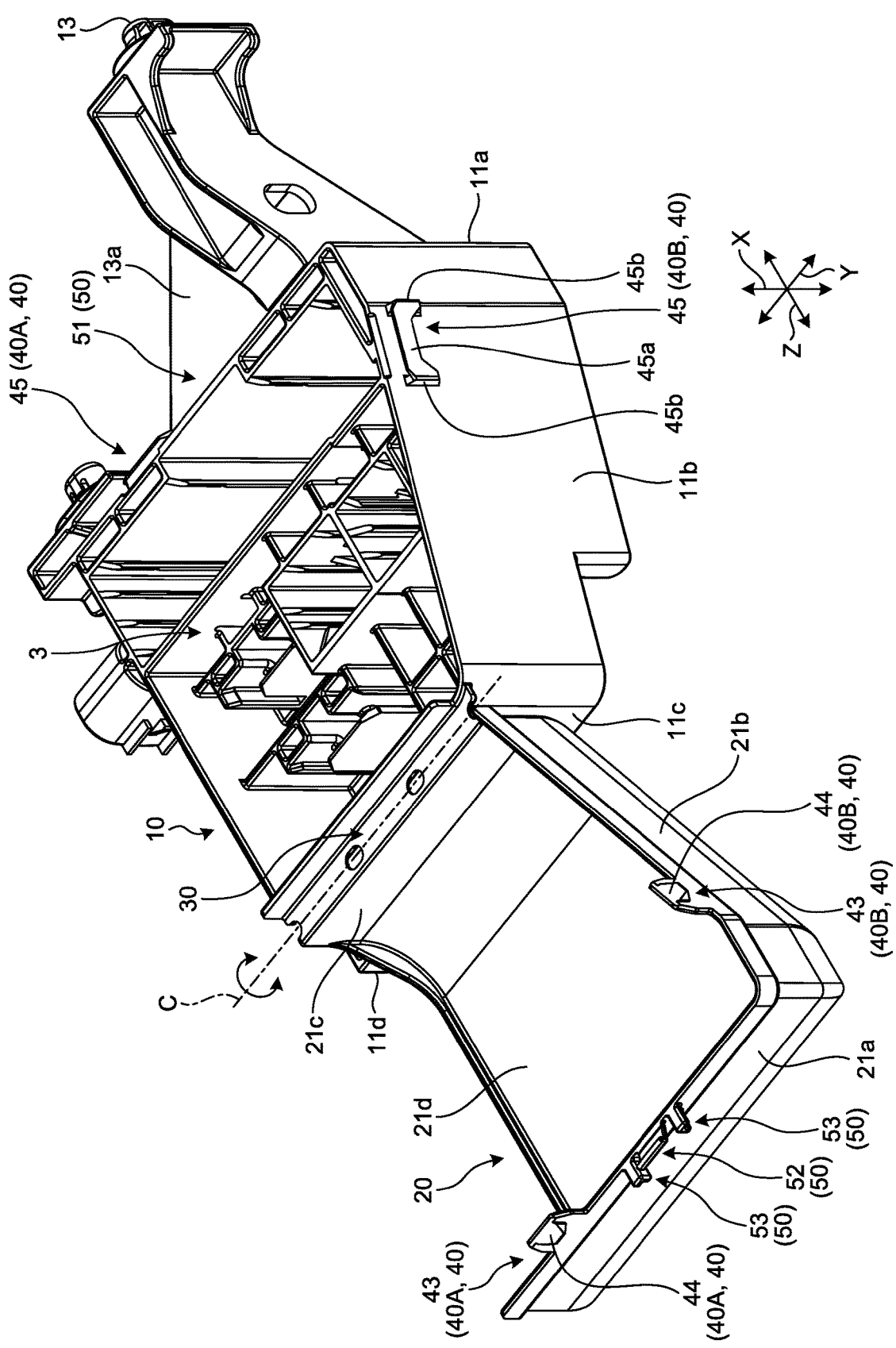
FIG. 4 is a perspective view illustrating a schematic configuration of the housing according to the embodiment.

The stabilizer mechanism 50 is a mechanism that applies biasing force to the cover member 20, and that eliminates looseness between the first locking surface 41 and the second locking surface 42. The number of the stabilizer mechanism 50 in the present embodiment is smaller than that of a plurality of the locking mechanisms 40. In this example, a single stabilizer mechanism 50 is provided. As illustrated in FIG. 1, FIG. 3, and FIG. 4, the stabilizer mechanism 50 in the present embodiment is provided on the wall parts 11a and 21a of the base member 10 and the cover member 20. In the base member 10 and the cover member 20, the wall parts 11a and 21a configure a surface placed opposite to the surface on which the hinge part 30 is placed, along the third direction Z. Furthermore, while the base member 10 and the cover member 20 are locked by the locking mechanism 40, when viewed from the rotation axis direction (when viewed from the second direction) that is when viewed along the rotation axis C, the stabilizer mechanism 50 in the present embodiment is placed away from the hinge part 30 than the first locking surface 41 and the second locking surface 42 of each locking mechanism 40. In other words, in the housing 1 of the present embodiment, when viewed from the rotation axis direction (when viewed from the second direction), the locking mechanisms 40 are placed between the stabilizer mechanism 50 and the hinge part 30.

More specifically, as illustrated in FIG. 1, FIG. 3, and FIG. 4, the stabilizer mechanism 50 includes a fitting surface 51, a biasing part 52, and a pair of protection projecting parts 53.

Figure 8:
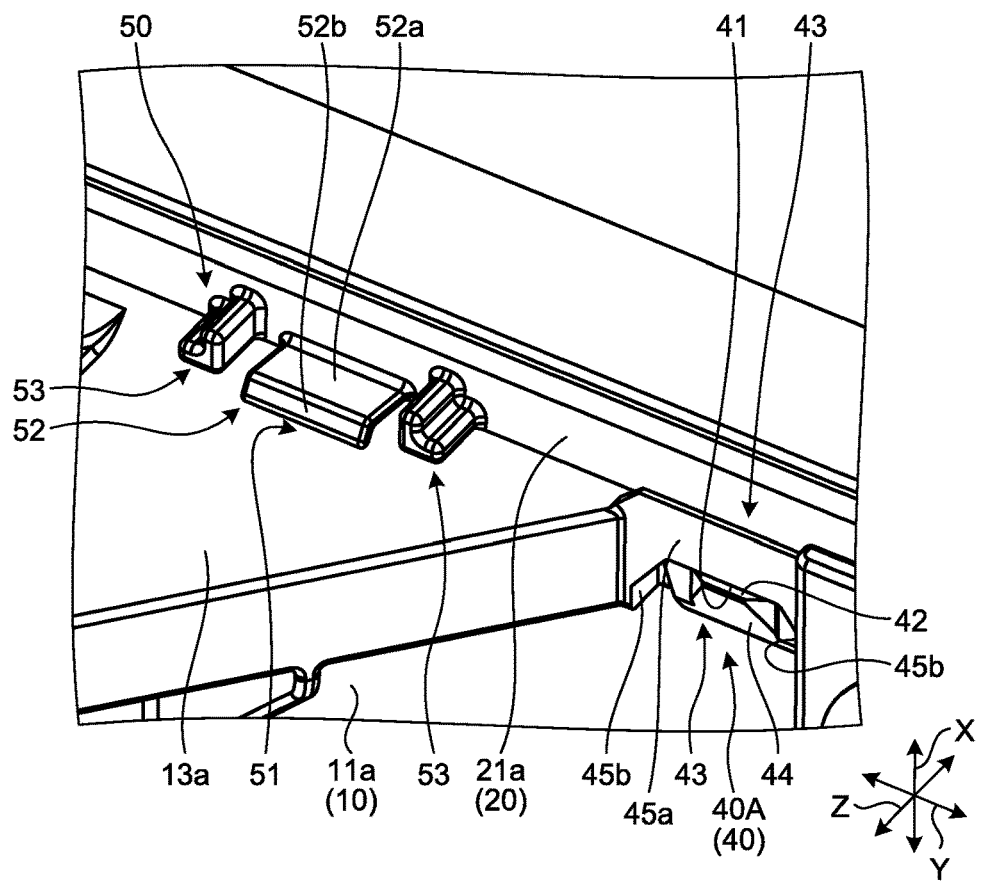
FIG. 8 is a fragmentary perspective view illustrating an operation of the housing according to the embodiment.

The fitting surface 51 is a surface that comes into contact with the biasing part 52, and that receives reaction force of the biasing force generated by the biasing part 52 (see also FIG. 8). The fitting surface 51 projects from the base member 10 to the outside. An external surface of the bracket part 13a that projects from the wall part 11a of the base member 10 to the outside is also used as the fitting surface 51 of the present embodiment. The fitting surface 51 is configured by a surface of the bracket part 13a at the cover member 20 side in the first direction X. The fitting surface 51 is formed as a flat surface that extends along the second direction Y and the third direction Z.

The biasing part 52 generates biasing force for pressing the second locking surface 42 toward the first locking surface 41 side along the first direction X. The biasing part 52 also configures a predetermined stabilizer-shaped part. The biasing part 52 projects from the wall part 21a of the cover member 20 to the outside, and elastically and deformably provided along the first direction X. In the wall part 21a, the biasing part 52 is formed at a position between the end part at the wall part 21b side in the second direction Y and the locking piece 43 of the locking mechanism 40A, which is a position that faces the fitting surface 51 on the bracket part 13a along the first direction X. While the base member 10 and the cover member 20 are locked by the locking mechanism 40, the biasing part 52 is elastically deformed by coming into contact with the fitting surface 51, and generates the biasing force for pressing the second locking surface 42 toward the first locking surface 41 side along the first direction X.

Figure 6:
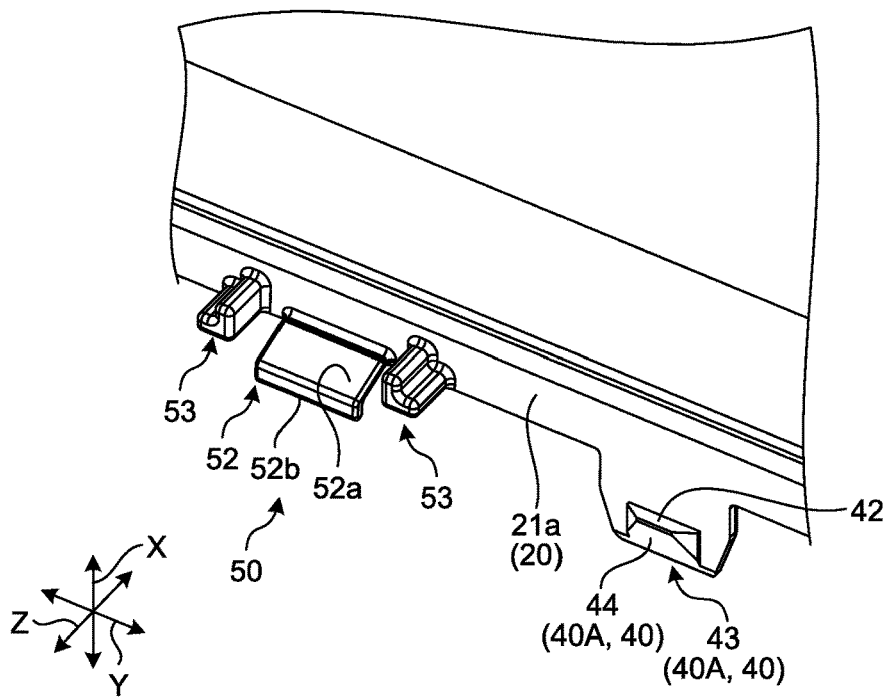
FIG. 6 is a fragmentary perspective view of the housing according to the embodiment including a stabilizer mechanism.
Figure 7:
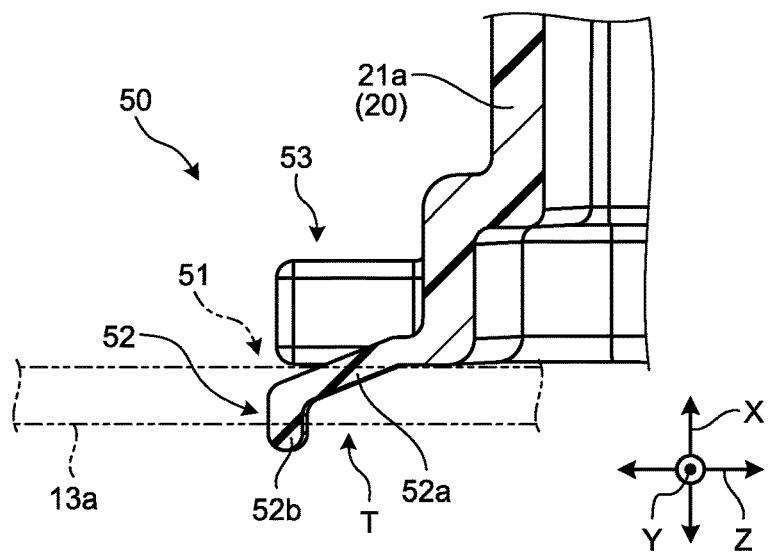
FIG. 7 is a fragmentary sectional view of the housing according to the embodiment including the stabilizer mechanism.

More specifically, as illustrated in FIG. 6 and FIG. 7, the biasing part 52 includes an extended part 52a and a bent end part 52b. The extended part 52a extends from the wall part 21a of the cover member 20 along a direction intersecting with the first direction X. The extended part 52a is formed in a substantially rectangular plate shape projecting from the wall part 21a of the cover member 20 toward one side in the third direction Z. The bent end part 52b is placed at the tip end side of the extended part 52a, and is bent from the extended part 52a toward the fitting surface 51 side along the first direction X.

In the extended part 52a, the end part at the bent end part 52b side is slightly inclined with respect to the third direction Z so as to extend toward the fitting surface 51 side. More specifically, while the cover member 20 is at the open position, the extended part 52a is inclined with respect to the third direction Z, so as to proceed to a region T (see FIG. 7) at the side where the base member 10 is placed, using the fitting surface 51, while the cover member 20 is at the close position, as the boundary (see the fitting surface 51 virtually illustrated by the two-dot chain line in FIG. 7, and the like). In other words, while the cover member 20 is at the open position, in the biasing part 52, the end part of the extended part 52a at the bent end part 52b side is placed in the region T. With this configuration, while the cover member 20 is at the close position, the biasing part 52 is elastically deformed along the first direction X by coming into contact with the fitting surface 51, and can generate the biasing force along the first direction X.

The pair of protection projecting parts 53 project from the cover member 20 to the outside, are disposed with the biasing part 52 interposed therebetween, and protect the biasing part 52. The pair of protection projecting parts 53 project from the wall part 21a of the cover member 20 to the outside along the third direction Z, and with the biasing part 52 interposed therebetween with respect to the second direction Y. Each of the protection projecting parts 53 is formed so that the projection amount along the third direction Z is the same as that of the biasing part 52. The protection projecting part 53 is formed in a substantially L-shaped column, and is configured as a section that has relatively high rigidity than that of the biasing part 52.

Figure 9:
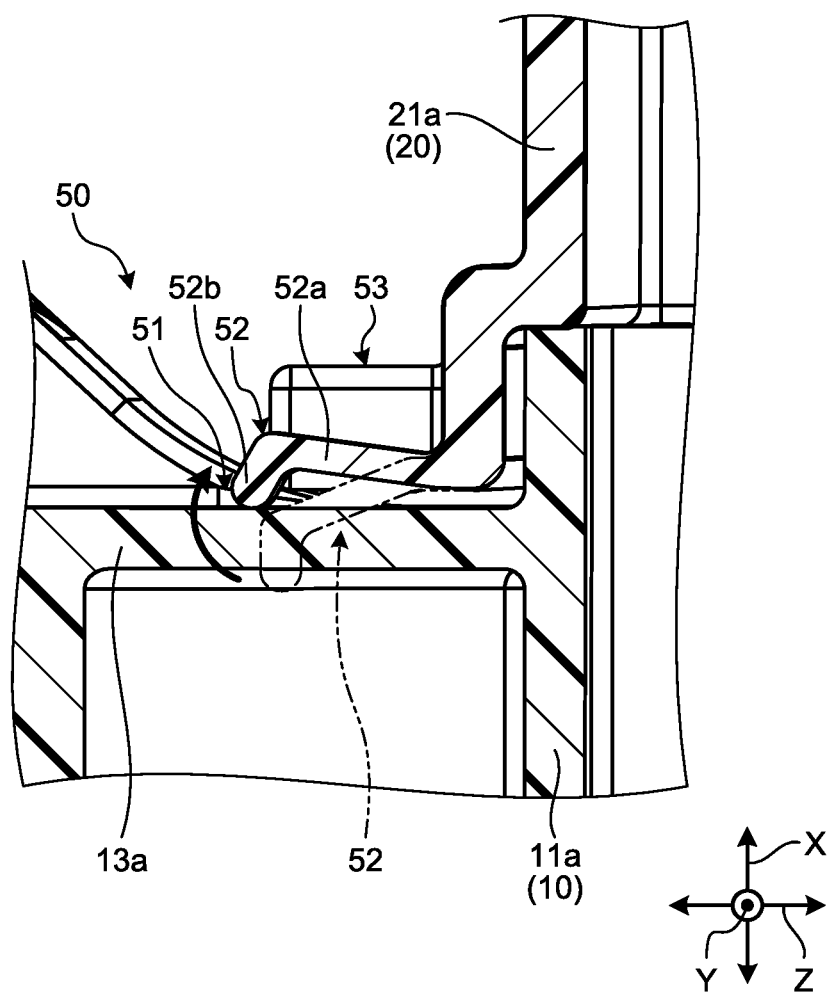
FIG. 9 is a fragmentary sectional view illustrating an operation of the housing according to the embodiment.

In the stabilizer mechanism 50 configured as described above, while the cover member 20 is placed at the close position, and the base member 10 and the cover member 20 are locked by the locking mechanism 40, as illustrated in FIG. 8 and FIG. 9, the bent end part 52b of the biasing part 52 comes into contact with the fitting surface 51. In the stabilizer mechanism 50, when the bent end part 52b of the biasing part 52 comes into contact with the fitting surface 51, the entire biasing part 52 including the extended part 52a is bent, and is elastically deformed along the first direction X (see particularly FIG. 9). When the biasing part 52 is elastically deformed along the first direction X, the stabilizer mechanism 50 generates the biasing force for separating the base member 10 and the cover member 20 along the first direction X. In other words, the biasing force for separating the base member 10 and the cover member 20 along the first direction X is the biasing force for pressing the cover member 20 upward with respect to the base member 10 along the first direction X. As a result, with the biasing force generated by the biasing part 52, the stabilizer mechanism 50 can press the second locking surface 42 toward the first locking surface 41 side along the first direction X with the cover member 20.

The housing 1 and the wire harness WH described above can store therein the object to be stored 2 by the base member 10 and the cover member 20. In this case, in the locking mechanism 40, when the first locking surface 41 and the second locking surface 42 are locked in the first direction X, the housing 1 can lock the base member 10 and the cover member 20 to each other. Then, when the biasing part 52, which projects from the cover member 20 to the outside, is elastically deformed by coming into contact with the fitting surface 51, which projects from the base member 10 to the outside, the housing 1 can press the second locking surface 42 toward the first locking surface 41 side, by the biasing force generated by the biasing part 52. With this configuration, as illustrated in FIG. 5, while the base member 10 and the cover member 20 are locked by the locking mechanism 40, the housing 1 can eliminate looseness between the first locking surface 41 and the second locking surface 42, by the fitting surface 51 and the biasing part 52. As a result, the housing 1 and the wire harness WH can prevent looseness between the first locking surface 41 and the second locking surface 42, and suitably prevent abnormal noise from occurring. For example, the housing 1 and the wire harness WH can suitably prevent abnormal noise caused by vehicle vibration and the like from occurring.

Moreover, when the second locking surface 42 is pressed toward the first locking surface 41 side by the biasing force generated by the biasing part 52, the housing 1 can reduce the looseness toward a direction intersecting with the first direction X, by the friction force generated on the contact surface between the first locking surface 41 and the second locking surface 42. In this point also, the housing 1 and the wire harness WH can suitably prevent abnormal noise from occurring.

Furthermore, the housing 1 can independently provide the stabilizer mechanism 50 for preventing looseness between the first locking surface 41 and the second locking surface 42, at a location different from that of the locking mechanism 40. Consequently, for example, compared to when a rib and the like is provided between the locking piece 43 and the part to be locked 45 to eliminate looseness, the housing 1 can prevent an excessive increase in force required for locking by the locking mechanism 40, while preventing the looseness between the first locking surface 41 and the second locking surface 42. In this point also, the housing 1 and the wire harness WH can suitably prevent abnormal noise from occurring.

Still furthermore, because the reaction force of the biasing force generated by the biasing part 52 can be stably received by the fitting surface 51 projecting from the base member 10 to the outside, the housing 1 can stabilize the contact force generated when the biasing part 52 presses the second locking surface 42 toward the first locking surface 41 side. In this point also, the housing 1 and the wire harness WH can suitably prevent abnormal noise from occurring. Moreover, in this example, because the external surface of the bracket part 13a that projects from the base member 10 to the outside is also used as the fitting surface 51, the housing 1 can suitably prevent abnormal noise from occurring, while preventing an increase in the size.

Still furthermore, in the housing 1, the stabilizer mechanism 50 for preventing looseness between the first locking surface 41 and the second locking surface 42 projects from the base member 10 and the cover member 20 to the outside. With this configuration, the housing 1 can provide the stabilizer mechanism 50 without affecting the storage space part 3 provided in the interior for storing the object to be stored 2. As a result, the housing 1 can efficiently secure the storage space part 3 for storing the object to be stored 2, while preventing the looseness between the first locking surface 41 and the second locking surface 42 by the stabilizer mechanism 50. Moreover, the housing 1 can prevent reduction in workability of the storage space part 3. Furthermore, because the stabilizer mechanism 50 projects from the base member 10 and the cover member 20 to the outside as described above, for example, the housing 1 can prevent the shape of the portion in a mold for molding the housing 1, from which the stabilizer mechanism 50 is formed, from becoming complicated. In these points also, the housing 1 and the wire harness WH can suitably prevent abnormal noise from occurring.

Still furthermore, because the stabilizer mechanism 50 includes the pair of protection projecting parts 53, the housing 1 and the wire harness WH described above can protect the biasing part 52 by the pair of protection projecting parts 53. With this configuration, for example, because the pair of protection projecting parts 53 can prevent the biasing part 52 from coming into contact with another object during transportation and the like, the housing 1 can prevent the biasing part 52 from being deformed. In other words, by protecting the biasing part 52 by the pair of protection projecting parts 53, the housing 1 can eliminate contradictory (contradictory of the biasing part 52 coming into contact with another object and easily deformed) caused by forming the biasing part 52 so as to project from the cover member 20 to the outside.

Still furthermore, in the housing 1 and the wire harness WH described above, the biasing part 52 includes the extended part 52a and the bent end part 52b. With this configuration, the biasing part 52 can secure the necessary biasing force with a more compact shape. As a result, the housing 1 and the wire harness WH can suitably prevent abnormal noise from occurring, with a more compact configuration.

In the housing 1 and the wire harness WH described above, the stabilizer mechanism 50 is provided on the wall parts 11a and 21a that face the surface on which the hinge part 30 is placed, in the base member 10 and the cover member 20. With this configuration, while the cover member 20 is rotatably supported by the base member 10 via the hinge part 30, the housing 1 can place the stabilizer mechanism 50 on the wall parts 11a and 21a with which looseness tends to increase relatively. As a result, by the biasing force of the stabilizer mechanism 50, the housing 1 can effectively press the second locking surface 42 toward the first locking surface 41 side, and prevent looseness from occurring. This effect is particularly effective in the locking mechanism 40A provided on the wall parts 11a and 21a.

Still furthermore, in the housing 1 and the wire harness WH described above, while the base member 10 and the cover member 20 are locked by the locking mechanism 40, when viewed from the rotation axis direction, the stabilizer mechanism 50 is provided at a position away from the hinge part 30 than the locking mechanisms 40. With this configuration, when viewed from the rotation axis direction, the housing 1 can effectively apply a suitable amount of pressing force by the biasing force of the stabilizer mechanism 50, on the first locking surface 41 and the second locking surface 42 that are placed between the stabilizer mechanism 50 and the hinge part 30. As a result, the housing 1 and the wire harness WH can more suitably prevent abnormal noise from occurring.

In this example, because the stabilizer mechanism 50 is configured as described above, the housing 1 and the wire harness WH described above can stably press the second locking surface 42 of each of the locking mechanisms 40 toward the first locking surface 41 side, by the smaller number of stabilizer mechanism 50 than that of the locking mechanism 40. As a result, the housing 1 and the wire harness WH can suitably prevent abnormal noise from occurring, while preventing an increase in the size.

It is to be understood that the housing and the wire harness according to the embodiment of the present invention described above are not limited to the embodiment described above, and various modifications may be made without departing from the spirit and scope of the appended claims.

In the above description, in the base member 10 and the cover member 20, the stabilizer mechanism 50 is provided on the wall parts 11a and 21a that face the surface on which the hinge part 30 is placed. However, it is not limited thereto. Moreover, in the above description, while the base member 10 and the cover member 20 are locked by the locking mechanism 40, when viewed from the rotation axis direction, the stabilizer mechanism 50 is placed away from the hinge part 30 than the locking mechanisms 40. However, it is not limited thereto. The positional relation between the stabilizer mechanism 50 and the locking mechanisms 40 is not limited to the above-described relation. Furthermore, in the above description, the number of stabilizer mechanism 50 is smaller than that of the locking mechanisms 40. However, it is not limited thereto. The number of stabilizer mechanism 50 may also be the same as that of the locking mechanism 40, or may be more than that of the locking mechanism 40.

In the above description, the stabilizer mechanism 50 includes the pair of protection projecting parts 53. However, it is not limited thereto. The stabilizer mechanism 50 may not include the pair of protection projecting parts 53.

In the above description, the biasing part 52 includes the extended part 52a and the bent end part 52b. However, it is not limited thereto. For example, the biasing part 52 may not include the bent end part 52b.

In the above description, the first member is configured by the base member 10, and the second member is configured by the cover member 20. Alternatively, the first member may be configured by the cover member 20, and the second member may be configured by the base member 10. In this case, the fitting surface 51 will be provided on the cover member 20 side, and the biasing part 52 and the protection projecting part 53 will be provided on the base member 10 side. Moreover, in this case, the first locking surface 41 will be provided on the cover member 20 side, and the second locking surface 42 will be provided on the base member 10 side.

In the above description, the locking piece 43 is provided on the cover member 20, and the part to be locked 45 is provided on the base member 10. Alternatively, the locking piece 43 may be provided on the base member 10, and the part to be locked 45 may be provided on the cover member 20.

In the above description, the base member 10 and the cover member 20 are integrally formed via the hinge part 30. However, it is not limited thereto. The housing 1 may not include the hinge part 30, and the base member 10 and the cover member 20 may be formed separately, and assembled to each other by the locking mechanisms 40.

The housing and the wire harness according to the present embodiment can store therein an object to be stored by the first member and the second member. In this case, in the locking mechanism, when the first locking surface and the second locking surface are locked in the first direction, the housing and the wire harness can lock the first member and the second member to each other. When the biasing part, which projects from the second member to the outside, is elastically deformed by coming into contact with the fitting surface, which projects from the first member to the outside, the housing and the wire harness can press the second locking surface toward the first locking surface side by the biasing force generated by the biasing part. With this configuration, while the first member and the second member are locked by the locking mechanism, the housing and the wire harness can eliminate looseness between the first locking surface and the second locking surface, by the fitting surface and the biasing part. As a result, the housing and the wire harness can advantageously prevent looseness between the first locking surface and the second locking surface, and suitably prevent abnormal noise from occurring.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A housing, comprising:
   a first member and a second member that face opposite to each other along a first direction, that are assembled to each other, and that store therein an object to be stored;
   a locking mechanism disposed at a first position and that includes a first locking surface provided on the first member and a second locking surface provided on the second member, and that locks the first member and the second member when the first locking surface and the second locking surface are locked to each other in the first direction; and
   a stabilizer mechanism disposed at a second position and that includes a fitting surface projecting from the first member to outside, and a biasing part that projects from the second member to the outside, that is elastically and deformably provided along the first direction to urge the first member away from the second member at the first and second positions, that is elastically deformed by coming into contact with the fitting surface while the first member and the second member are locked by the locking mechanism, and that generates biasing force for pressing the second locking surface toward the first locking surface side along the first direction.

2. The housing according to claim 1, wherein
   the stabilizer mechanism includes a pair of protection projecting parts that project from the second member to the outside, and that are disposed with the biasing part interposed therebetween.

3. The housing according to claim 1, wherein
   the biasing part includes an extended part that extends from the second member along a direction intersecting with the first direction, and a bent end part that is placed at a tip end side of the extended part and that is bent from the extended part toward the fitting surface.

4. The housing according to claim 2, wherein
   the biasing part includes an extended part that extends from the second member along a direction intersecting with the first direction, and a bent end part that is placed at a tip end side of the extended part and that is bent from the extended part toward the fitting surface.

5. The housing according to claim 1, further comprising:
   a hinge part that rotatably supports the second member with respect to the first member, wherein
   the stabilizer mechanism is provided on a surface that faces a surface on which the hinge part is placed, in the first member and the second member.

6. The housing according to claim 2, further comprising:
   a hinge part that rotatably supports the second member with respect to the first member, wherein
   the stabilizer mechanism is provided on a surface that faces a surface on which the hinge part is placed, in the first member and the second member.

7. The housing according to claim 3, further comprising:
   a hinge part that rotatably supports the second member with respect to the first member, wherein
   the stabilizer mechanism is provided on a surface that faces a surface on which the hinge part is placed, in the first member and the second member.

8. The housing according to claim 4, further comprising:
   a hinge part that rotatably supports the second member with respect to the first member, wherein
   the stabilizer mechanism is provided on a surface that faces a surface on which the hinge part is placed, in the first member and the second member.

9. The housing according to claim 5, wherein
   the stabilizer mechanism is placed away from the hinge part than the locking mechanism, when viewed from a rotation axis direction that is when viewed along a rotation axis serving as a rotation center of the first member and the second member, while the first member and the second member are locked by the locking mechanism.

10. The housing according to claim 6, wherein
    the stabilizer mechanism is placed away from the hinge part than the locking mechanism, when viewed from a rotation axis direction that is when viewed along a rotation axis serving as a rotation center of the first member and the second member, while the first member and the second member are locked by the locking mechanism.

11. The housing according to claim 7, wherein
    the stabilizer mechanism is placed away from the hinge part than the locking mechanism, when viewed from a rotation axis direction that is when viewed along a rotation axis serving as a rotation center of the first member and the second member, while the first member and the second member are locked by the locking mechanism.

12. The housing according to claim 8, wherein
    the stabilizer mechanism is placed away from the hinge part than the locking mechanism, when viewed from a rotation axis direction that is when viewed along a rotation axis serving as a rotation center of the first member and the second member, while the first member and the second member are locked by the locking mechanism.

13. The housing according to claim 1, wherein
    the locking mechanisms includes a plurality of locking mechanisms, and number of the stabilizer mechanism is smaller than that of the locking mechanisms.

14. The housing according to claim 2, wherein
    the locking mechanisms includes a plurality of locking mechanisms, and number of the stabilizer mechanism is smaller than that of the locking mechanisms.

15. The housing according to claim 3, wherein
    the locking mechanisms includes a plurality of locking mechanisms, and number of the stabilizer mechanism is smaller than that of the locking mechanisms.

16. The housing according to claim 4, wherein
the locking mechanisms includes a plurality of locking mechanisms, and number of the stabilizer mechanism is smaller than that of the locking mechanisms.

17. The housing according to claim 5, wherein
the locking mechanisms includes a plurality of locking mechanisms, and number of the stabilizer mechanism is smaller than that of the locking mechanisms.

18. The housing according to claim 6, wherein
the locking mechanisms includes a plurality of locking mechanisms, and number of the stabilizer mechanism is smaller than that of the locking mechanisms.

19. The housing according to claim 9, wherein
the locking mechanisms includes a plurality of locking mechanisms, and number of the stabilizer mechanism is smaller than that of the locking mechanisms.

20. A wire harness, comprising:
a wire material with conductivity; and
a housing assembled to the wire material, wherein
the housing includes
a first member and a second member that face opposite to each other along a first direction, that are assembled to each other, and that store therein an object to be stored,
a locking mechanism disposed at a first position and that includes a first locking surface provided on the first member and a second locking surface provided on the second member, and that locks the first member and the second member when the first locking surface and the second locking surface are locked to each other in the first direction, and
a stabilizer mechanism disposed at a second position and that includes a fitting surface projecting from the first member to outside, and a biasing part that projects from the second member to the outside, that is elastically and deformably provided along the first direction to urge the first member away from the second member at the first and second positions, that is elastically deformed by coming into contact with the fitting surface while the first member and the second member are locked by the locking mechanism, and that generates biasing force for pressing the second locking surface toward the first locking surface side along the first direction.

\* \* \* \* \*